United States Patent
Wong et al.

(10) Patent No.: US 9,559,704 B1
(45) Date of Patent: Jan. 31, 2017

(54) FRACTIONAL-N PHASE-LOCKED LOOP WITH REDUCED JITTER

(71) Applicant: Xilinx, Inc., San Jose, CA (US)

(72) Inventors: Anna W. Wong, Palo Alto, CA (US); Ankur Jain, Sunnyvale, CA (US); Richard W. Swanson, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/938,741

(22) Filed: Nov. 11, 2015

(51) Int. Cl.
    *H03L 7/08*     (2006.01)
    *H03L 7/197*     (2006.01)

(52) U.S. Cl.
    CPC ........... *H03L 7/0805* (2013.01); *H03L 7/1974* (2013.01)

(58) Field of Classification Search
    CPC .................................................... H03L 7/0805
    See application file for complete search history.

(56) References Cited

U.S. PATENT DOCUMENTS

| 7,791,385 B2 * | 9/2010 | Huang | H03K 23/68 327/150 |
| 7,876,136 B2 * | 1/2011 | Ha | H03L 7/0896 327/148 |
| 8,471,611 B2 * | 6/2013 | Sfikas | H03L 7/091 327/147 |

* cited by examiner

*Primary Examiner* — Hai L Nguyen
(74) *Attorney, Agent, or Firm* — Robert M. Brush

(57) ABSTRACT

In an example, operating a PLL circuit includes generating an error signal in response to comparison of a reference clock signal having a reference frequency and a feedback clock signal having a feedback frequency, generating a plurality of clock signals having an output frequency based on the error signal, and generating the feedback clock signal from the plurality of clock signals based on a first divider value and a control value derived from a second divider value. Operating the PLL circuit further includes multiplying each of a first integer value and a first fractional value by a power of two to generate a second integer value and a second fractional value, respectively, generating the second divider value using a sigma-delta modulator (SDM) based on the second integer value and the second fractional value, and dividing the second divider value by the power of two to generate the first divider value.

20 Claims, 3 Drawing Sheets

FRACTIONAL-N PHASE-LOCKED LOOP WITH REDUCED JITTER

TECHNICAL FIELD

Examples of the present disclosure generally relate to electronic circuits and, in particular, to a fractional-N phase-locked loop (PLL) with reduced jitter.

BACKGROUND

A frequency synthesizer, such as a phase-locked loop (PLL) can be used to provide a clock signal of a desired frequency. The PLL generates the clock signal based on a reference dock signal of a reference oscillator. An integer-N PLL is capable of generating a dock signal having a frequency that is an integer multiple of the reference frequency. A fractional-N PLL is capable of generating a clock signal having a frequency that is a non-integer multiple of the reference frequency. A fractional-N PLL is more flexible than an integer-N PLL due to its higher frequency resolution. Compared with an integer-N PLL, however, a fractional-N PLL can exhibit increased phase noise (jitter) due to generation of fractional boundary spurs ("fractional jitter"). To reduce fractional jitter, designers typically reduce the bandwidth of the fractional-N PLL. A greater ratio of the reference clock frequency to the PLL bandwidth leads to better jitter rejection. Such a reduction in PLL bandwidth, however, results in longer lock times and can cause excessive voltage controlled oscillator (VCO) phase noise to appear at the PLL output leading to higher random jitter. It is therefore desirable to reduce fractional jitter without the need to reduce PLL bandwidth.

SUMMARY

Techniques for providing a fractional-N phase-locked loop (PLL) with reduced jitter are described. In an example, a PLL circuit includes an error detector operable to generate an error signal in response to comparison of a reference clock signal having a reference frequency and a feedback clock signal having a feedback frequency. The PLL further includes an oscillator, coupled to the error detector, operable to provide a plurality of clock signals having an output frequency based on the error signal. The PLL further includes a fractional frequency divider, coupled to the oscillator, operable to generate the feedback clock signal from the plurality of clock signals based on signals providing a first divider value and a control value derived from a second divider value. The PLL further includes a multiplier operable to multiply signals providing a first integer value and a first fractional value by a power of two to generate signals providing a second integer value and a second fractional value, respectively. The PLL further includes a sigma-delta modulator (SDM) operable to generate the signal providing the second divider value based on the signal providing the second integer value and the signal providing the second fractional value. The PLL further includes a divider operable to divide the signal providing the second divider value by the power of two to generate the signal providing the first divider value.

In another example, an integrated circuit (IC) includes at least one circuit, an input operable to receive a reference clock signal having a reference frequency from a reference oscillator, and a PLL coupled to each of the at least one circuit. The PLL circuit includes an error detector operable to generate an error signal in response to comparison of the reference clock signal and a feedback clock signal having a feedback frequency. The PLL further includes an oscillator, coupled to the error detector, operable to provide a plurality of clock signals having an output frequency based on the error signal. The PLL further includes a fractional frequency divider, coupled to the oscillator, operable to generate the feedback clock signal from the plurality of clock signals based on signals providing a first divider value and a control value derived from a second divider value. The PLL further includes a multiplier operable to multiply signals providing a first integer value and a first fractional value by a power of two to generate signals providing a second integer value and a second fractional value, respectively. The PLL further includes a sigma-delta modulator (SDM) operable to generate the signal providing the second divider value based on the signal providing the second integer value and the signal providing the second fractional value. The PLL further includes a divider operable to divide the signal providing the second divider value by the power of two to generate the signal providing the first divider value.

A method of operating a PLL circuit includes generating an error signal in response to comparison of a reference clock signal having a reference frequency and a feedback clock signal having a feedback frequency. The method further includes generating a plurality of clock signals having an output frequency based on the error signal. The method further includes generating the feedback clock signal from the plurality of clock signals based on a first divider value and a control value derived from a second divider value. The method further includes multiplying each of a first integer value and a first fractional value by a power of two to generate a second integer value and a second fractional value, respectively. The method further includes generating the second divider value using a sigma-delta modulator (SDM) based on the second integer value and the second fractional value. The method further includes dividing the second divider value by the power of two to generate the first divider value.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
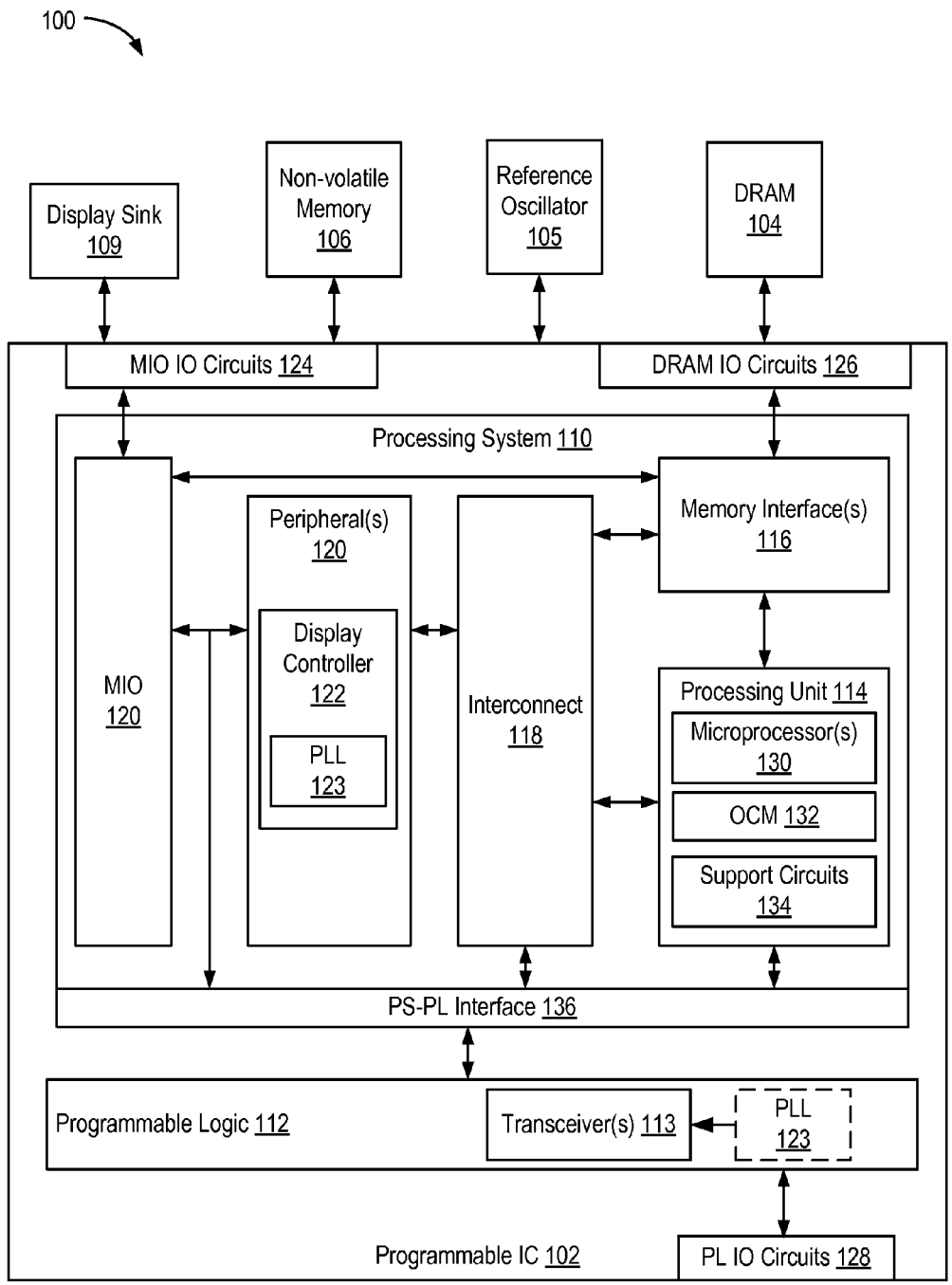
FIG. 1 is a block diagram depicting an example programmable system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

FIG. 1 is a block diagram depicting an example programmable system 100. The programmable system 100 includes a programmable integrated circuit (IC) 102 coupled to various circuits, such as a dynamic random access memory (DRAM) 104, non-volatile memory 106, display sink 109, and a reference oscillator 105. The DRAM 104 can include various types of volatile memory circuits, such as synchronous DRAM, double data rate synchronous DRAM, and the like. The non-volatile memory 106 can include various types of non-volatile memory circuits, such as FLASH memory, electrically erasable programmable read only memory (EEPROM), and the like. The display sink 109 comprises a circuit that processes display data formatted in accordance with a display protocol (e.g., DisplayPort, high-definition multimedia interface (HDMI), digital visual interface (DVI), etc.).

The programmable IC 102 can include a processing system 110 and programmable logic 112. The programmable IC 102 can include a system on chip (SoC) that integrates a microprocessor-based processing system with programmable logic of a field programmable gate array (FPGA), complex programmable logic device (CPLD), or the like. The processing system 110 can be coupled to various input/output (IO) circuits of the programmable IC 102, including multiplexed IO (MIO) circuits 124 and DRAM IO circuits 126. The display sink 109 can be coupled to the MIO IO circuits 124, and the DRAM 104 can be coupled to the DRAM IO circuits 126. The programmable logic 112 can be coupled to programmable logic (PL) IO circuits 128.

The processing system 110 can include a processing unit 114, one or more memory interfaces (memory interface(s) 116), interconnect 118, one or more peripherals (peripheral(s) 120), an MIO circuit (MIO 120), and a PS-PL interface 136, among other components. The processing unit 114 can be coupled to the memory interface(s) 116. The memory interface(s) 116 can include DRAM memory controllers, non-volatile memory controllers, and the like. The memory interface(s) 116 can be coupled the DRAM IO circuits 126 to communicate with the DRAM 104. The processing unit 114, the memory interface(s) 116, and the peripheral(s) 120 can be coupled to the interconnect 118. The peripheral(s) 120 and the memory interface(s) 116 can also be coupled to the MIO 120, which is in turn coupled to the MIO IO circuits 124. The peripheral(s) 120 can communicate with other circuits through the MIO 120 and the MIO IO circuits 124. The memory interface(s) 116 can communicate with the non-volatile memory 106 through the MIO 120 and the MIO IO circuits 124. The MIO 120 multiplexes interfaces of the peripheral(s) 120 and the memory interface(s) 116 among the MIO IO circuits 124. The peripheral(s) 120, the interconnect 118, and the processing unit 114 can be coupled to the PS-PL interface 136 for communicating with the programmable logic 112.

The processing unit 114 includes one or more microprocessors (microprocessor(s) 130), on-chip memory (OCM) 132, and support circuits 134. The microprocessor(s) 130 can include any type of microprocessors known in the art. The OCM 132 can include cache memory, local memory, or the like. The support circuits 134 can include various types of circuits, such as interrupt controller(s), direct memory access (DMA) controllers, timers, registers, interconnect, cache controllers, and the like.

The processing system 110 (PS) is coupled to the programmable logic 112 (PL) through the PS-PL interface 136. The programmable logic 112 can communicate with the processing unit 114, the memory interface(s) 116, and the peripheral(s) 120 of the processing system 110. For example, the programmable logic 112 can interrupt the processing unit 114, access memory through the memory interface(s) 116 or within the processing unit 114, and access IO interfaces of the peripheral(s) 120.

In an example, the peripheral(s) 120 include a display controller 122. The display controller 122 generates display data formatted in accordance with one or more protocols. The display data can include pixel data for displaying image(s) on a display. The display data can also include audio data in combination with the pixel data. The display controller 122 can provide the display data to the display sink 109 through the MIO 120 and MIO IO circuits 124.

The display controller 122 can output the display data at different rates depending on the display protocol. The display controller 122 includes a PLL 123 configured to generate clock signal(s) used to operate the circuitry of the display controller 122 to output the display data. In an example, the different display data rates can be non-integer multiples of each other. Accordingly, the PLL 123 can be a fractional-N PLL configured to generate an output clock that is a non-integer multiple of a reference clock. The PLL 123 can receive a reference clock from the reference oscillator 105. An example of the PLL 123 is described below with respect to FIG. 2.

Figure 2:
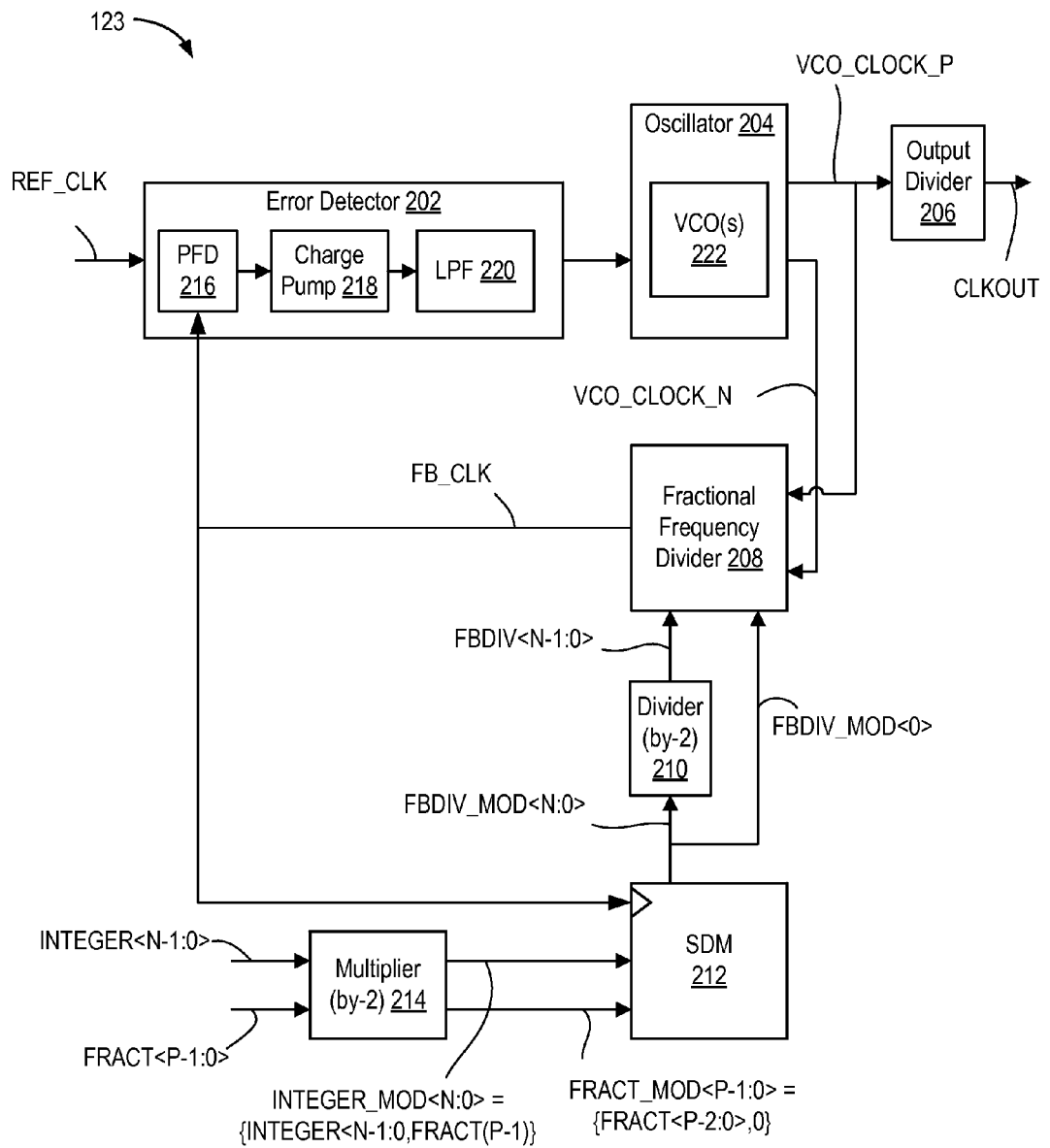
FIG. 2 is a block diagram depicting an example of a phase-locked loop (PLL) circuit according to an example.

FIG. 2 is a block diagram depicting an example of the PLL 123. In the example described above, the PLL 123 is part of the display controller 122 in the processing system 110 of the programmable IC 102. The PLL 123 shown in FIG. 2 can be used in other applications within the processing system 110 (e.g., in other peripherals 120), in other applications within the programmable IC 102 (e.g., in the programmable logic 112), or in other types of ICs. For example, the PLL 123 can be used by transceiver(s) 113 in the programmable logic 112. Thus, one or more instances of the PLL 123 can be coupled to circuit(s) in the processing system 110, the programmable logic 112, or both.

The PLL 123 includes an error detector 202, an oscillator 204, an output divider 206, a fractional frequency divider 208, a divider 210, a sigma-delta modulator (SDM) 212, and a multiplier 214. The error detector 202 is configured to receive a reference clock signal (REF_CLK) and a feedback clock signal (FB_CLK). An output of the error detector 202 is coupled to an input of the oscillator 204. The oscillator 204 can include one or more voltage controlled oscillators (VCOs) 222. Each VCO 222 can include an inductor-capacitor (LC)-based oscillator having a voltage-adjustable capacitance (e.g., varactor). Other types of VCOs known in the art can also be used. The oscillator 204 is configured to generate a first clock signal (VCO_CLOCK_P) and a second clock signal (VCO_CLOCK_N). The phase of the signal VCO_CLOCK_N is shifted 180 degrees with respect to the signal VCO_CLOCK_P. The output divider 206 receives the clock signal VCO_CLOCK_P and generates a clock signal (CLKOUT).

Inputs of the fractional frequency divider 208 receive the clock signals VCO_CLOCK_P and VCO_CLOCK_N. Additional inputs of the fractional frequency divider 208 receive a signal FBDIV<N−1:0> and a signal FBDIV_MOD<0>. The signal FBDIV<N−1:0> includes N component signals, where N is an integer greater than one. At any given time, the signal FBDIV<N−1:0> conveys an N-bit value referred to herein as FBDIV[N−1:0] or FBDIV. The signal FBDIV_MOD<0> is one component signal of a signal FBDIV_MOD<N:0>. The signal FBDIV_MOD<N:0> includes N+1 component signals and, at any given time, conveys an (N+1)-bit value referred to herein as FBDIV_MOD[N:0] or FBDIV_MOD. The signal FBDIV_MOD<0> conveys FBDIV_MOD[0], which is the least significant bit of the value FBDIV_MOD. An output of the fractional frequency divider 208 provides the feedback clock signal FB_CLK, which is coupled to the error detector 202 as described above.

An input of the divider 210 receives the signal FBDIV_MOD<N:0>. An output of the divider 210 provides the signal FBDIV<N−1:0>. Inputs of the multiplier 214 receive signals INTEGER<N−1:0> and FRACT<P−1:0>, respectively. The signal INTEGER<N−1:0> includes N component signals and, at any given time, conveys an N-bit value referred to herein as INTEGER[N−1:0] or INTEGER. The signal FRACT<P—1:0> includes P component signals, where P is an integer greater than one. At any given time, the signal FRACT<P−1:0> conveys an P-bit value referred to herein as FRACT[P−1:0] or FRACT. The multiplier 214 generates signals INTEGER_MOD<N:0> and FRACT_MOD<P−1:0>. The signal INTEGER_MOD<N:0> includes N+1 component signals and, at any given time, conveys an (N+1)-bit value referred to herein as INTEGER_MOD[N:0] or INTEGER_MOD. The signal FRACT_MOD<P−1:0> includes P component signals and, at any given time, conveys a P-bit value referred to herein as FRACT_MOD[P−1:0] or FRACT_MOD. The SDM 212 receives the signals INTEGER_MOD<N:0> and FRACT_MOD<P−1:0> and generates the signal FBDIV_MOD<N:0>. A clock port of the SDM 212 as receives the feedback clock signal FB_CLK.

The multiplier 214 forms an (N+P)-bit multiplicand word from INTEGER[N−1:0] and FRACT[P−1:0], where INTEGER[N−1:0] comprises the N most significant bits of the multiplicand word and FRACT[P−1:0] comprises the P least significant bits of the multiplicand word. In the example, the multiplier 214 multiplies the multiplicand word by two (i.e., the multiplier is two). For example, the multiplier 214 can perform a one-bit binary shift left (BSL) operation on the (N+P)-bit multiplicand word. The multiplier 214 outputs an (N+1+P)-bit product word, where FRACT_MOD[P−1:0] comprises the P least significant bits and INTEGER_MOD[N:0] comprises the N+1 most significant bits.

In operation, the oscillator 204 selects a VCO 222 (if more than one VCO 222 is present) and generates the clock signals VCO_CLOCK_P and VCO_CLOCK_N. The oscillator 204 can include multiple VCOs 222 in order to provide different selectable frequency bands. The oscillator 204 can include a control port coupled to a controller (not shown) for controlling which VCO 222 is selected. The output divider 206 receives the clock signal VCO_CLOCK_P and generates the clock signal CLKOUT. The output divider 206 can divide or multiply the clock signal VCO_CLOCK_P by any integer to generate the clock signal CLKOUT. In some examples, the output divider 206 can be omitted and the clock signal VCO_CLOCK_P can be the output of the PLL 123. The frequency of the clock signal VCO_CLOCK_P ($f_{VCO}$) is the frequency of the reference clock REF_CLOCK ($f_{ref}$) divided by TOTAL_DIVIDE, where the divisor TOTAL_DIVIDE equals INTEGER+FRACT/2^P. For example, if INTEGER=40, FRACT=16,384, and P=16, then TOTAL_DIVIDE=40.25 and $f_{VCO}$ is $f_{ref}$ divided by 40.25.

The error detector 202 is configured to compare the reference clock REF_CLK with the feedback clock FB_CLK and determine an error signal. The oscillator 204 receives the error signal from the error detector 202 and adjusts the oscillation frequency of the selected VCO 222.

In the example shown, the error detector 202 includes a phase-frequency detector (PFD) 216, a charge pump 218, and a low-pass filter (LPF) 220. The PFD 216 includes an input to receive the reference clock signal REF_CLK and another input to receive the feedback clock signal FB_CLK. The PFD 216 includes an output coupled to an input of the charge pump 218. The charge pump 218 includes an output coupled to an input of the LPF 220. The PFD 216 compares the reference clock signal REF_CLK and the feedback clock signal FB_CLK and outputs up and down control signals ("UD signals") based on the difference in phase. The charge pump 218 is activated by the UD signals. When the phase difference is greater than ±2π, the PFD 216 controls the charge pump 218 to source or sink a constant current depending on which of the reference frequency and the feedback frequency is higher. For example, the PFD 216 can control the charge pump 218 to source a constant current if the reference frequency is higher than the feedback frequency and sink a constant current if the reference frequency is lower than the feedback frequency. Once the phase difference is less than 2π, the PFD 216 controls the charge pump 218 so that the charge pump 218 is only active (sourcing or sinking current) for a portion of each phase detector cycle that is proportional to the phase difference between the two signals. The LPF 220 integrates the current and outputs a continuously changing control voltage for controlling the oscillator 204. Once the phase difference between the reference and feedback clock signals reaches approximately zero, the PLL 123 enters the phase locked state. Those skilled in the art will appreciate that other types of error detectors can also be used.

The fractional frequency divider 208 generates the feedback clock signal FB_CLK from the clock signals VCO_CLOCK_P and VCO_CLOCK_N. The frequency of the feedback clock signal FB_CLK ($f_{fb}$) can be an integral or fractional division of the frequency of the clock signal VCO_CLOCK_P ($f_{VCO}$). In the example, $f_{fb}$ is equal to $f_{VCO}$ divided by M, where M equals FBDIV+0.5*FBDIV_MOD[0]. Since FBDIV_MOD[0] is either zero or one, the divisor M is either an integer or an integer plus 0.5. When the divisor M is an integer, the fractional frequency divider 208 can toggle the feedback clock signal FB_CLK based on a count of the positive edges of VCO_CLOCK_P. When the divisor M is fractional, the fractional frequency divider 208 can toggle the feedback clock signal FB_CLK based on a count of the positive edges of VCO_CLOCK_P and a count of positive edges of VCO_CLOCK_N (i.e., the counts of the positive and negative edges of VCO_CLOCK_P). The fractional frequency divider 208 can include counters, flip-flops, logic gates, multiplexers, and the like configured to generate the feedback clock signal FB_CLK from the clock signals VCO_CLOCK_P and VCO_CLOCK_N.

The divisor M is controlled by setting values of INTEGER and FRACT. As discussed above, the divisor TOTAL_DIVIDE of the PLL 123 is equal to INTEGER+FRACT/2^P. The multiplier 214 doubles the value of a multiplicand formed from INTEGER and FRACT to generate a product comprising INTEGER_MOD and FRACT_MOD. For example, the multiplier 214 can perform a binary left shift operation. The SDM 212 modulates the value of FBDIV_MOD to achieve a divisor of TOTAL_DIVIDE*2. For example, assume INTEGER=40, FRACT=16,384, and P=16. In such case, TOTAL_DIVIDE=40.25 and TOTAL_DIVIDE*2=80.5. The SDM 212 (assuming first order) changes the value of FBDIV_MOD between 80 and 81 to produce the effective divisor of TOTAL_DIVIDE*2.

The divider 210 then divides FBDIV_MOD by two to generate FBDIV. For example, the divider 210 can perform a binary right shift operation. In the example above, FBDIV_MOD is 40 (e.g., both 80/2 and 81/2 equal 40 in a binary right shift operation). As noted above, the divisor M=FBDIV+0.5*FBDIV_MOD[0]. When FBDIV_MOD=80, M=40+0.5*0=40. When FBDIV_MOD=81, M=40+0.5*1=40.5. By checking the value of FBDIV_MOD[0], the fractional frequency divider 208 can determine whether integer division by 40 or fractional division by 40.5 should be performed. As such, the fractional frequency divider 208 divides the VCO frequency by a divisor M that alternates between 40 and 40.5 and the divisor TOTAL_DIVIDE of the PLL 123 is 40.25.

Consider a PLL where the multiplier 214 and the divider 210 are removed. In such case, to achieve a divisor TOTAL_DIVIDE=40.25, an SDM would dither the divisor M of the feedback divider between 40 and 41 (assuming a first order SDM). That is, an SDM would set the divisor M to be 40 three times out of every four times, e.g., (40*3+41*1)/4=40.25. With the PLL 123, to achieve a divisor TOTAL_DIVIDE=40.25, the divisor M of the fractional frequency divider 208 is dithered alternately between 40 and 40.5. As such, the PLL 123 of the present example is dividing with finer resolution divisors. Since the divisor M of the fractional frequency divider 208 is changed using a finer resolution, the instantaneous change in frequency output by the PLL 123 is smaller, leading to reduced jitter. The PLL 123 reduces jitter without the need of reducing bandwidth. Further, the PLL 123 reduces jitter without requiring an increase in the order of the SDM 212 and the use of higher-order filters to filter out the reshaped quantization noise due to fractional divide ratios. Use of higher-order filters makes stabilizing the PLL more difficult, requires increased area, and adds complexity to the PLL design.

In an example, the SDM 212 can be implemented using a multi-stage noise shaping (MASH) structure either having a fixed order or a programmable order. In the examples above, the SDM 212 is assumed to be a first-order SDM. However, in other examples, the SDM 212 can be a higher-order SDM. In still other examples, the order of the SDM 212 can be dynamically adjusted. Thus, while the PLL 123 can reduce jitter without the need of higher-order SDM, the PLL 123 can be used with a higher-order SDM to further reduce jitter.

In the examples above, the fractional frequency divider 208 can perform K.5 division using two phases of the VCO output (e.g., VCO_CLOCK_P and VCO_CLOCK_N). The fractional frequency divider 208 can perform division of a finer resolution using more phases of the VCO output. For example, the fractional frequency divider 208 can perform K.25 division using four phases of the VCO output (e.g., 0 degree, 90 degree, 180 degree, and 270 degree phases). In such an example, the multiplier 214 can multiply the multiplicand formed from INTEGER and FRACT by four and the divider 210 can divide FBDIV_MOD by four.

Figure 3:
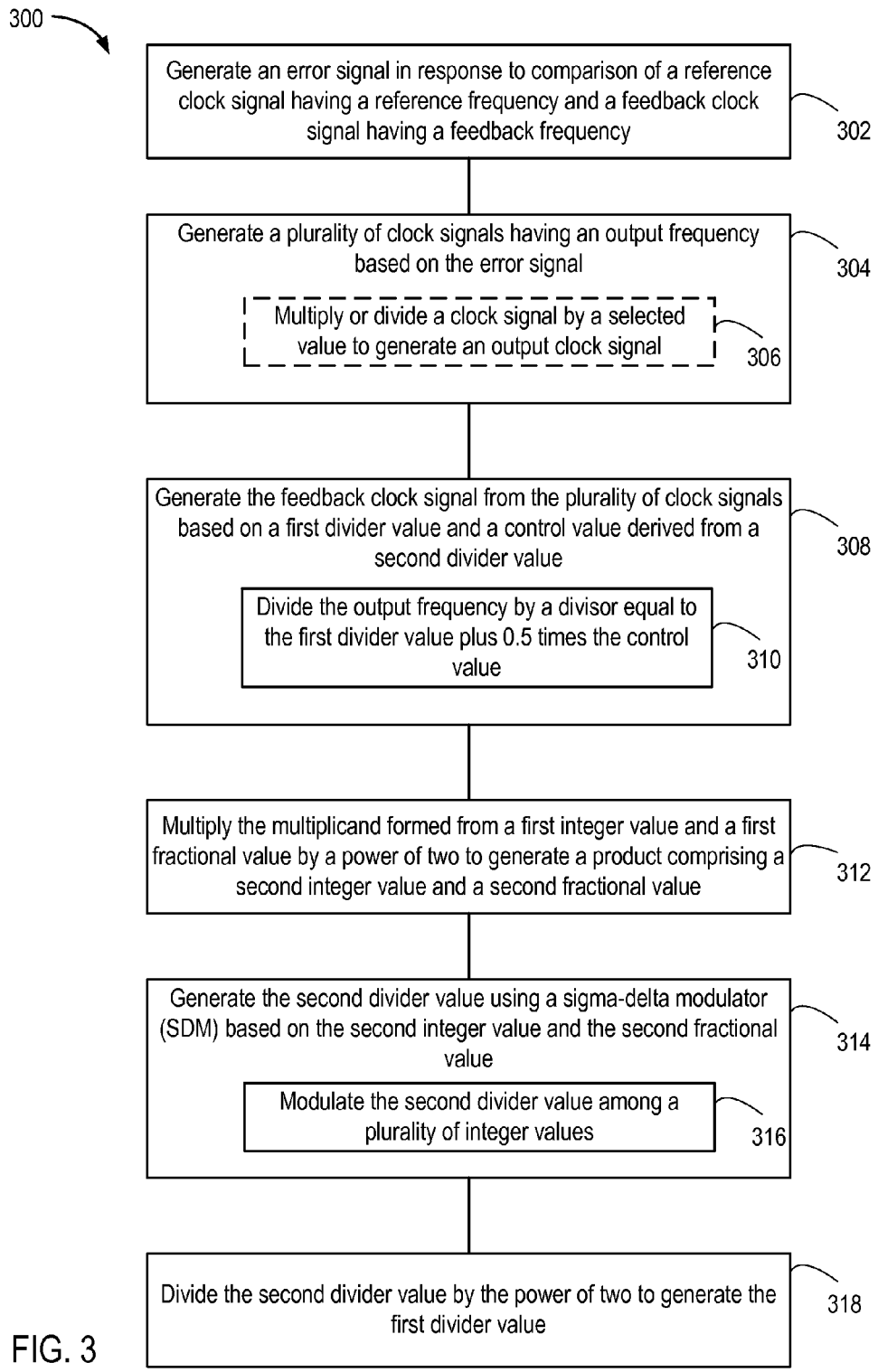
FIG. 3 is a flow diagram depicting a method of operating the PLL circuit of FIG. 2 according to an example.

FIG. 3 is a flow diagram depicting a method 300 of operating the PLL circuit 123 according to an example.

Notably, the sequence of steps shown in the method 300 are for purposes of clarity by example and are not meant to impart any specific order of the operations as performed by the PLL 123. Rather, the PLL 123 comprises a circuit that performs such operations concurrently given the inputs REF_CLK, INTEGER, and FRACT. The method 300 begins at step 302, where the error detector 202 generates an error signal in response to comparison of a reference clock signal (REF_CLK) having a reference frequency and a feedback clock signal (FB_CLK) having a feedback frequency.

At step 304, the oscillator 204 generates a plurality of clock signals having an output frequency based on the error signal. For example, the oscillator 204 can generate two clock signals that are 180 degrees out of phase (e.g., VCO_CLOCK_P and VCO_CLOCK_N). At optional step 306, output divider 206 can multiply or divide a clock signal (e.g., VCO_CLOCK_P) by a selected value to generate an output clock signal (CLKOUT). In another example, the oscillator 204 can output more than two clock signals (e.g., four clock signals successively 90 degrees out of phase).

At step 308, the fractional frequency divider 208 generates a feedback clock signal from the plurality of clock signals based on a first divider value and a control value derived from a second divider value. For example, the fractional frequency divider 208 can generate the feedback clock signal FB_CLK from clock signals VCO_CLOCK_P and VCO_CLOCK_N based on FBDIV (first divider value) and FBDIV_MOD[0] (control value). That is, the fractional frequency divider 208 can implement K.5 division. The SDM 212 generates FBDIV_MOD (second divider value), and FBDIV_MOD[0] (control value) is the LSB of FBDIV_MOD. If the oscillator 204 generates four clock signals, the fractional frequency divider 208 can implement K.25 division. In such an example, the control value would comprise the two LSBs of FBDIV.

In an example, at step 310, the fractional frequency divider 208 divides the output frequency by a divisor (M) equal to the first divider value (e.g., FBDIV) plus 0.5 times the control value (e.g., 0.5*FBDIV_MOD[0]). That is, the fractional frequency divider 208 can perform K.5 division as described above. If the fractional frequency divider 208 implements K.25 division, the divisor (M) equals FBDIV+0.5*FBDIV_MOD[1]+0.25*FBDIV_MOD[0].

At step 312, the multiplier 214 multiplies of the multiplicand formed from a first integer value and a first fractional value by a power of two to generate a product comprising a second integer value and a second fractional value. For example, the multiplier 214 can multiply the multiplicand formed from INTEGER and FRACT by two to generate a product comprising INTEGER_MOD and FRACT_MOD. In an example where the fractional frequency divider 208 implements K.25 division, then the multiplier 214 can multiply the multiplicand formed from INTEGER and FRACT by four.

At step 314, the SDM 212 generates a second divider value based on the second integer value and the second fractional value. For example, the SDM 212 can generate FBDIV_MOD based on INTEGER_MOD and FRACT_MOD. At step 316, the SDM 212 can modulate the second divider value among a plurality of integer values. For example, if the SDM 212 is a first-order SDM, the SDM 212 can modulate FBDIV_MOD between an integer (e.g., 80) and the integer plus one (e.g., 81).

At step 318, the divider 210 divides the second divider value by the power of two to generate the first divider value. For example, the divider 210 can divide FBDIV_MOD by two to generate FBDIV. In an example where the fractional frequency divider 208 implements K.25 division, then the divider 210 can divide FBDIV_MOD by four.

While the foregoing is directed to specific examples, other and further examples may be devised without departing from the basic scope thereof, and the scope thereof is determined by the claims that follow.

What is claimed is:

1. A phase-locked loop (PLL) circuit, comprising:
an error detector operable to generate an error signal in response to comparison of a reference clock signal having a reference frequency and a feedback clock signal having a feedback frequency;
an oscillator, coupled to the error detector, operable to provide a plurality of clock signals having an output frequency based on the error signal;
a fractional frequency divider, coupled to the oscillator, operable to generate the feedback clock signal from the plurality of clock signals based on signals providing a first divider value and a control value derived from a second divider value;
a multiplier operable to multiply signals providing a first integer value and a first fractional value by a power of two to generate signals providing a second integer value and a second fractional value, respectively;
a sigma-delta modulator (SDM) operable to generate the signal providing the second divider value based on the signal providing the second integer value and the signal providing the second fractional value; and
a divider operable to divide the signal providing the second divider value by the power of two to generate the signal providing the first divider value.

2. The PLL circuit of claim 1, wherein the plurality of clock signals comprises a first clock signal and a second clock signal, a phase of the second clock signal being shifted 180 degrees with respect to the first clock signal.

3. The PLL circuit of claim 2, wherein the fractional frequency divider implements a divisor equal to the first divider value plus 0.5 times the control value.

4. The PLL circuit of claim 3, wherein the control value comprises a least significant bit (LSB) of the second divider value.

5. The PLL circuit of claim 3, wherein the SDM is operable to modulate the second divider value between a first value and the first value plus one.

6. The PLL circuit of claim 1, wherein the SDM comprises a first-order SDM.

7. The PLL circuit of claim 1, further comprising:
an output divider, coupled to the oscillator, operable to multiply or divide a clock signal of the plurality of clock signals by a selected value to generate an output clock signal.

8. An integrated circuit (IC), comprising:
at least one circuit;
an input operable to receive a reference clock signal having a reference frequency from a reference oscillator; and
a phase-locked loop (PLL), coupled to each of the at least one circuit, the PLL comprising:
an error detector operable to generate an error signal in response to comparison of the reference clock signal and a feedback clock signal having a feedback frequency;
an oscillator, coupled to the error detector, operable to provide a plurality of clock signals having an output frequency based on the error signal;
a fractional frequency divider, coupled to the oscillator, operable to generate the feedback clock signal from the plurality of clock signals based on signals providing a first divider value and a control value derived from a second divider value;
a multiplier operable to multiply signals providing a first integer value and a first fractional value by a power of two to generate signals providing a second integer value and a second fractional value, respectively;
a sigma-delta modulator (SDM) operable to generate the signal providing the second divider value based on the signal providing the second integer value and the signal providing the second fractional value; and
a divider operable to divide the signal providing the second divider value by the power of two to generate the signal providing the first divider value.

9. The IC claim 8, wherein the plurality of clock signals comprises a first clock signal and a second clock signal, a phase of the second clock signal being shifted 180 degrees with respect to the first clock signal, and wherein the fractional frequency divider implements a divisor equal to the first divider value plus 0.5 times the control value.

10. The IC of claim 9, wherein the control value comprises a least significant bit (LSB) of the second divider value, and wherein the SDM is operable to modulate the second divider value between a first value and the first value plus one.

11. The IC of claim 8, wherein the SDM comprises a first-order SDM.

12. The IC of claim 8, wherein the PLL further comprises:
an output divider, coupled to the oscillator, operable to multiply or divide a clock signal of the plurality of clock signals by a selected value to generate an output clock signal.

13. The IC of claim 8, further comprising:
a processing system; and
programmable logic coupled to the processing system;
wherein the at least one circuit is disposed in the processing system.

14. The IC of claim 8, further comprising:
a processing system; and
programmable logic coupled to the processing system;
wherein the at least one circuit is disposed in the programmable logic.

15. A method of operating a phase-locked loop (PLL) circuit, comprising:
generating an error signal in response to comparison of a reference clock signal having a reference frequency and a feedback clock signal having a feedback frequency;
generating a plurality of clock signals having an output frequency based on the error signal;
generating the feedback clock signal from the plurality of clock signals based on a first divider value and a control value derived from a second divider value;
multiplying each of a first integer value and a first fractional value by a power of two to generate a second integer value and a second fractional value, respectively;
generating the second divider value using a sigma-delta modulator (SDM) based on the second integer value and the second fractional value; and
dividing the second divider value by the power of two to generate the first divider value.

16. The method claim 15, wherein the plurality of clock signals comprises a first clock signal and a second clock signal, a phase of the second clock signal being shifted 180 degrees with respect to the first clock signal.

17. The method of claim 16, wherein the step of generating the feedback clock signal comprises dividing the output frequency by a divisor equal to the first divider value plus 0.5 times the control value.

18. The method of claim 17, wherein the control value comprises a least significant bit (LSB) of the second divider value.

19. The method of claim 16, wherein the step of generating the second divider signal comprises modulating the second divider value between a first value and the first value plus one.

20. The method of claim 15, further comprising:
   multiplying or dividing a clock signal of the plurality of clock signals by a selected value to generate an output clock signal.

* * * * *